United States Patent [19]

Zeininger et al.

[11] Patent Number: 5,576,223
[45] Date of Patent: Nov. 19, 1996

[54] METHOD OF DEFECT DETERMINATION AND DEFECT ENGINEERING ON PRODUCT WAFER OF ADVANCED SUBMICRON TECHNOLOGIES

[75] Inventors: Heinz Zeininger, Erlangen; Werner M. Klingenstein, Kirchheim, both of Germany

[73] Assignee: Siemens Aktiengesellschaft, Munich, Germany

[21] Appl. No.: 317,148

[22] Filed: Oct. 3, 1994

Related U.S. Application Data

[63] Continuation of Ser. No. 40,695, Mar. 31, 1993, abandoned.
[51] Int. Cl.$^6$ ............................ H01L 21/26; G01R 31/26
[52] U.S. Cl. .................... 437/8; 437/52; 437/203
[58] Field of Search ........................ 437/8, 52, 203; 257/301; 324/158 R

[56] References Cited

U.S. PATENT DOCUMENTS

| | | | |
|---|---|---|---|
| 3,304,594 | 2/1967 | Madland | 29/25.3 |
| 3,615,463 | 10/1971 | Kuschell | 96/36.2 |
| 3,751,647 | 8/1973 | Maeder et al. | 235/151.11 |
| 3,842,491 | 10/1974 | Depuy et al. | 29/580 |
| 4,347,479 | 8/1982 | Cullet | 324/64 |
| 4,364,010 | 12/1982 | Watari et al. | 437/8 |
| 4,386,459 | 7/1983 | Boulin | 437/8 |
| 4,672,314 | 6/1987 | Kokkas | 437/8 |
| 4,739,388 | 4/1988 | Packeiser et al. | 357/68 |
| 4,855,253 | 8/1989 | Weber | 437/8 |
| 5,051,690 | 9/1991 | Maly et al. | 324/158 |

FOREIGN PATENT DOCUMENTS

| | | |
|---|---|---|
| 0213409 | of 0000 | European Pat. Off. . |
| 2707612 | 8/1978 | Germany . |
| 2030361 | of 0000 | United Kingdom . |

OTHER PUBLICATIONS

Szobonya, "Characterizations of; Silicon test Chips" 2nd Int. Autum Meeting proceedings: Gettering and Defect Engineering in the Semiconductor Technology 1987 pp. 214–215.

Alcorn et al. "Kerf Test Structure for process and Device Characterizations", Solid State Technology. May 1985, pp. 229–235.

"Test to Control Wafer Sensitivity to Defect Propagation", IBM Technical Disclosure Bulletin, vol. 25, No. 7A, Dec. 1982, New York, US, pp. 3155–3156.

Patent Abstract of Japan, vol. 16, No. 230 (E–1208) 27 May 1992 & JP-A-04 044 244.

Patent Abstracts of Japan, vol. 13, No. 433 (E–824) 27 Sep. 1989 & JP-A-01 161 845.

Patent Abstracts of Japan, vol. 6, No. 218 (E–139) 2 Nov. 1982 & JP-A-57 121 244.

Patent Abstracts of Japan, vol. 3, No. 132 (E–149) 6 Nov. 1979 & JP-A-54 110 787.

*Primary Examiner*—Tom Thomas
*Attorney, Agent, or Firm*—Adel A. Ahmed

[57] ABSTRACT

In a method of determining the possible formation of crystalline defects in a body of a semiconductor material during the process of fabricating integrated circuits in the body, at least one body is subjected to a full fabrication process to form completed integrated circuits in the body which can be electrically tested to determine whether the operation of the integrated circuit is adversely affected by the formation of crystalline defects. Test structures, each of which is only a portion of the complete integrated circuit, are formed during the formation of the complete circuit but are fabricated using only a group of a limited number of the steps of the fabrication process used to fabricate the complete integrated circuit with various ones of the test structures being subjected to different ones of the steps of the group of steps. The test structures may be formed on the same body as the complete circuit or on additional bodies. The test structures are then analyzed to determine which of the steps may have formed crystalline defects in the body.

7 Claims, 2 Drawing Sheets

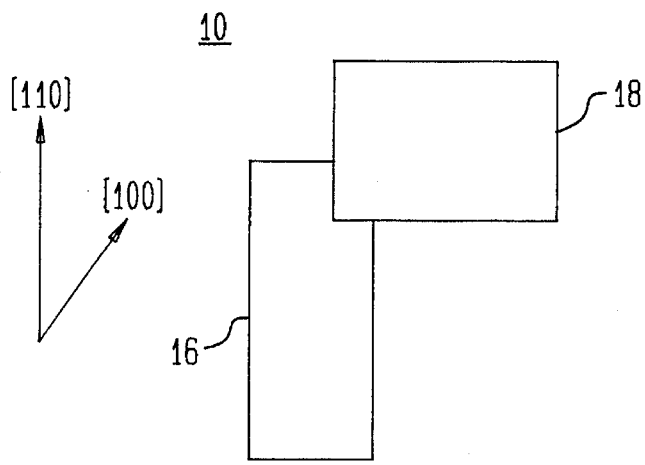
FIG. 3
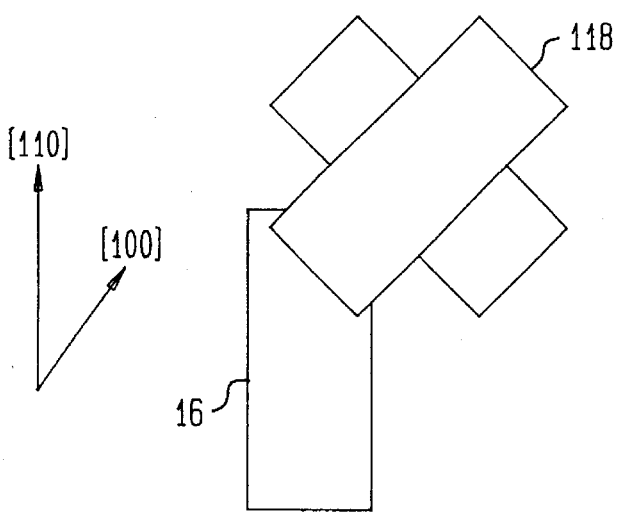
FIG. 4
FIG. 5
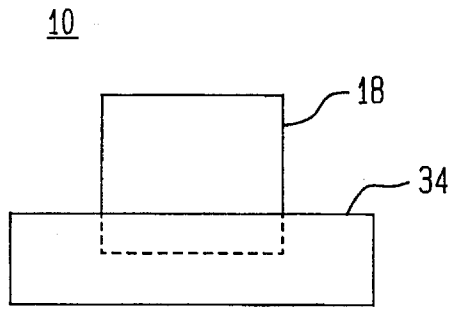
FIG. 6
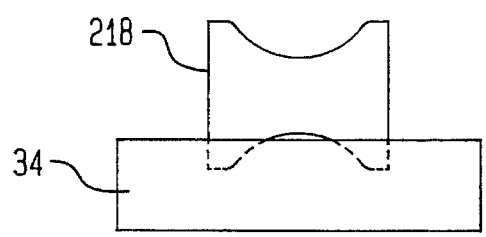

METHOD OF DEFECT DETERMINATION AND DEFECT ENGINEERING ON PRODUCT WAFER OF ADVANCED SUBMICRON TECHNOLOGIES

CROSS-REFERENCE TO RELATED APPLICATION

This is a continuation of Ser. No. 08/040,695 filed Mar. 31, 1993 now abandoned.

FIELD OF THE INVENTION

The present invention is directed to a faster and less expensive method of determining when crystalline defects are created in a semiconductor body, and, more particularly, to a method which can be exploited to determine which steps of a process of fabricating an integrated circuit, e.g, the formation of deep and shallow trenches, create a formation of undesirable crystalline defects.

BACKGROUND OF THE INVENTION

Integrated circuits comprise a body of a semiconductor material having formed therein various electrical components, such as transistors, diodes, capacitors, resistors, etc., which are connected together to form a desired circuit. Fabrication of an integrated circuit requires the use of many process techniques, such as depositions of various types, oxide growth, etching, ion-implantation, diffusion, heat treatment, etc. Each of these process techniques has its specific potential to cause crystalline defects in the semiconductor body. Specifically, for example, one of the process steps, formation of deep trenches, may generate dislocations. The contamination with metals during etching and cleaning has been correlated with stacking faults. Once the crystalline defects are formed, other processing techniques can increase the density of the crystalline defects to a level which adversely affects the operation of the integrated circuit. Whether a particular process of making an integrated circuit contains steps which create undesirable crystalline defects which adversely affect the electrical characteristics of the integrated circuit can only be determined after the integrated circuit is completely formed and can be electrically tested. For a complex fabrication process, this may take up to several weeks to several months. The interpretation of the results may be complicated because much of the data is not obviously evident to be directly related to crystalline defects, or directly correlated to any of the process steps. Spacial variations, like the temperature distribution across a wafer's surface, or wafer arrangement during processing, may come into play and hide why defects are formed. In a sequential type of development, after changes are made to the process, it takes a long time to fabricate another integrated circuit so as to determine whether the changes actually reduced or eliminated the undesirable crystalline defects.

Various attempts have been made during the development of a process for fabricating a particular integrated circuit to try to determine which steps of a long process may cause the creation of undesirable crystalline defects in the semiconductor body. One technique is to start out with a plurality of starting wafers. At various steps of the process a different wafer is removed and tested for possible defects. This technique has a disadvantage that it uses up a number of the wafers for testing during the process so that there are only a few wafers left at the end of the process for testing of completed integrated circuits. Also, there may be several steps which cause an undesirable effect so that pulling a wafer at a particular step of the process may not disclose which step actually caused the problem. For example, an etching step may cause some defects, but later heating steps may increase the defects to an undesirable level. The higher the process complexity, the lower the probability of combining test results of different wafers to make a determination as to what may have caused the creation of crystalline defects. Since there are a large number of chips on each wafer, if chip-to-chip variation is larger than wafer-to-wafer variation, it would be highly difficult to determine the problem(s) causing crystalline defects with the approach described above. Vertical tracking of monitor wafers has to assume a constant process and only approaches a solution by an educated guess after the analysis of various samples has been done. Thus, pulling and testing a wafer after an etching step does not necessarily result in a complete finding of a problem. Pulling a wafer after a heating step does not necessarily indicate where the problem initially occurred. Therefore, it is desirable to have a method for determining which step(s) of a process cause undesirable crystalline defects without using up a large number of wafers.

The dependence on various parameters cannot be correlated by a simple mono-causal analytical approach because the pulling of wafers after critical process steps and the investigation of failed cells typically does not provide enough information. In general, nucleation centers for the formation of dislocations are generated in damaged and highly stressed substrates or in contaminated wafers. Dislocations are often detected after low thermal budget annealing processes of high dose implantations into structure wafers with topography. Wafers that do not have any circuit features therein may not show any dislocations when subjected to the same high dose implants as wafers with circuit features therein. Crystal defect density is enhanced by the injection of impurities into a stressed substrate with a high point defect concentration. Crystal defects nucleate at sites of high stress. One such site can be the bottom of a box isolation (shallow trench) at high compressive stress caused by different oxidation rates on different crystal planes which may act as a Frank-Read source. This in turn results in punching out glide dislocations into the depletion zone which increases the junction leakage. The annealing processes provide means of enhancing the formation of dislocation as well as removing crystal damage depending on the actual process flow. Thus, contributing factors for formation of crystalline defects may be quite separated in an integrated process. Annealing steps and their sequence (high temperature/low temperature) are especially subject to the formation of dislocations.

SUMMARY OF THE INVENTION

In accordance with an aspect of the present invention, a method for reducing the density of crystalline defects formed in a semiconductor body during the process of fabricating an integrated circuit, comprises the steps of: performing a given number of sequential processing steps on at least one body of a semiconductor material for fabricating an integrated circuit; performing a smaller number of the sequential processing steps than the given number on at least one body of a semiconductor material for fabricating test structures, such that each of the test structures is fabricated by using a different sequence of processing steps of the smaller number of sequential processing steps; and testing the integrated circuit and the test structures to determine which of the processing steps is associated with crystalline defects.

In accordance with another aspect of the invention, the smaller number of the sequential processing steps are performed on the test structures at the same time as they are performed in the course of performing the given number of sequential processing steps for fabricating the integrated circuit.

In accordance with still another aspect of the invention, the test structures are formed on the same body of semiconductor material.

In accordance with still yet another aspect of the invention, the method further comprises the step of modifying a processing step determined to be associated with crystalline defects.

In accordance with yet another aspect of the invention, a method of reducing the density of crystalline defects formed in a semiconductor body during the process of making an integrated circuit comprises the steps of: subjecting at least one body of a semiconductor material to a given number of fabrication steps to make an integrated circuit which can be electrically tested; forming in at least one body of a semiconductor material test structures using a limited number of the steps used for making the integrated circuit, where the limited number is less than the given number, with each of the test structures being subjected to a different group of the limited number of steps; and testing the complete integrated circuit and the test structures to determine which of the steps results in the formation of crystalline defects.

In accordance with still yet another aspect of the invention, the limited number of steps are a group of sequential steps used for making the complete integrated circuit, and each of the test structures is subjected to a different selection of the group of steps.

In accordance with still another aspect of the invention, the test structures are subjected to the limited number of steps at the same time that the one body is subjected to the same steps during the carrying out of the given number steps to make the integrated circuit.

From still another aspect, the invention may be viewed as a method of testing an integrated circuit manufacturing process for determining the influence of the various steps of the process on the number of crystalline defects produced in the integrated circuit so that the steps determined to be associated with causing the defects can be modified to reduce the defects.

In particular, the testing involves the use of test structures, either embodied in the same or a different wafer as the integrated circuit being formed, and the test structures are made to experience various subsets of the set of sequential processing steps that are used to form the integrated circuits. More particularly, the test structures are formed to have selected components oriented along different crystallographic directions of the silicon wafer to detect the sensitivity of defect formation to such differences.

More specifically, the invention is primarily applicable to dynamic random access memories that use switched capacitor memory cells sharing a combination of deep narrow capacitive trenches and wide shallow isolation trenches in the silicon body that houses the memory. In such manufacture, for low defects it has been found advantageous to form the deep narrow trenches in a 110 crystallographic orientation and the shallow wide trenches in a 100 crystallographic orientation. Additionally, by the same general approach, it was also found advantageous in the manufacture to shape the shallow trenches so as to reduce their overlap with the gates of the silicon memory cells.

In accordance with a further aspect, the present invention is directed to a method of reducing crystalline defect density in a semiconductor body of an integrated circuit which is caused during the process of fabricating the integrated circuit. The method comprises the steps of subjecting at least one body of a semiconductor material to all of the steps necessary to make a complete integrated circuit which can be tested. Test structures are formed in a body of semiconductor material using a limited number of the steps of making the complete integrated circuit with each of the test structures being subjected to different groups of the limited number of steps. The complete integrated circuit and the test structures are tested to determine which of the steps results in the formation of crystalline defects.

The invention will be better understood from the following more detailed description taken with the accompanying claims and drawings.

BRIEF DESCRIPTION OF THE DRAWINGS

FIG. 3 is a schematic view of a combination of patterns that form a portion of the integrated circuit shown in FIG. 1 which was found to generate undesirable crystalline defects;

FIG. 4 is a schematic view of a specific test pattern similar to the pattern shown in FIG. 3, but which has been modified to overcome the undesirable crystalline defects generated by the pattern shown in FIG. 3; and FIGS. 5 and 6 are schematic views of different test patterns laid out to investigate the relation between a transistor gate and the edge of a shallow trench isolation to achieve a method of overcoming the formation of crystalline defects.

DETAILED DESCRIPTION

Figure 1:
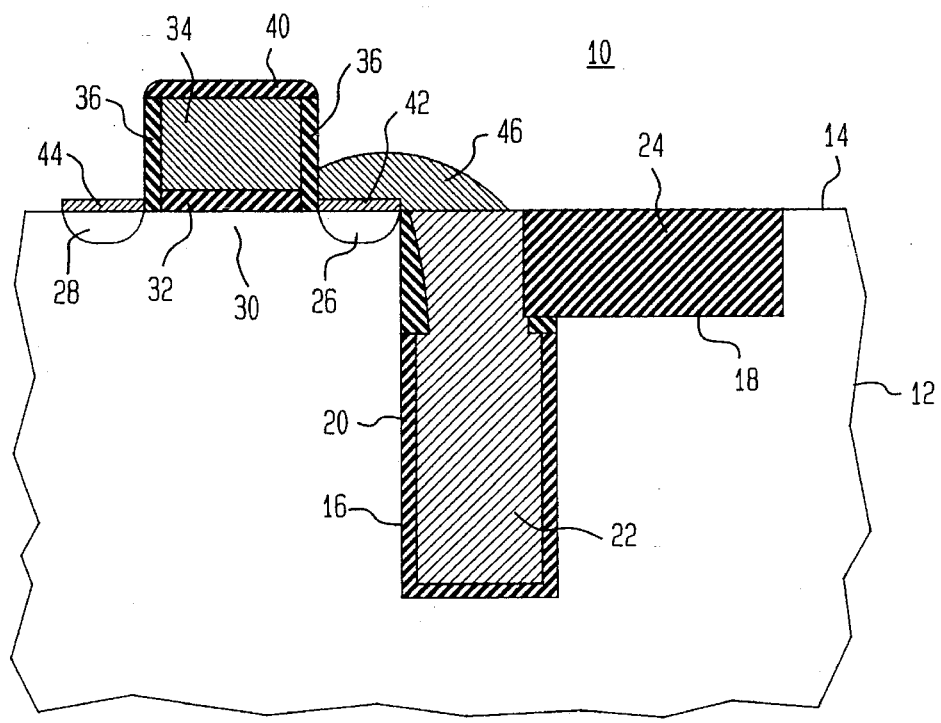
FIG. 1 is a sectional view of a portion of an integrated circuit with which a method in accordance with the present invention can be used.

The present invention is directed to a method of determining which step(s) in a proposed process for fabricating an integrated circuit causes a formation of crystalline defects in a body of a semiconductor material which adversely affects the operation of the integrated circuit. Once the particular step(s) which causes the undesirable crystalline defects is determined, that step(s) can be changed to reduce (limit) and/or prevent the formation of the defects. This method is particularly useful in the initial development of a process for fabricating a particular integrated circuit. Once all of the steps of the process which create the crystalline defects have been determined and changed, the resulting process can then be used to commercially manufacture the integrated circuit.

The method of the present invention comprises starting out with a plurality of wafers of a semiconductor material, such as single crystalline silicon. Some of the wafers are subjected to a complete process so as to form completed integrated circuits which can be electrically tested. Test structures are formed simultaneously with the completed integrated circuits. The test structures are portions of a completed integrated circuit which are formed by the most critical steps of the process which can result in crystalline defects. The test structures are formed by a group of sequential process steps with each test structure being formed by different ones of the steps of the group so that each test structure has a different one of the steps left out when the test structures are formed. It will be convenient to define the various processes used to form the test structures as subsets of the set of processing steps on which improvements are sought to be made. The particular step left out can be achieved by eliminating a mask sequence used in making the integrated circuit. The test structures can be formed on wafers separate from the wafer on which the completed integrated circuits are formed, or can be formed in parallel on the same wafer as the completed integrated circuit using stepper lithography. Also, a plurality of the completed integrated circuits are generally formed on a single wafer with each completed integrated circuit forming a chip. If the test structures are formed on the same wafer as the completed integrated circuits, the test structures can be formed on each chip with a completed integrated circuit, or on separate chips, or on only some of the chips.

The test structures provide for quick and significant contributions on defect studies on product wafers. This concept allows a direct comparison of failed circuits/devices on a wafer. An analysis of the test structures on each wafer or chip provides information of the interaction of certain masks used at a defined series of process steps. It is known that certain steps which are normally used in the manufacture of integrated circuits can, under certain conditions, cause the formation of crystalline defects in the semiconductor wafer. It is also known that other steps, such as heat treatment steps, can cause the density of any crystalline defects which may be in the wafer to increase. When a step or a group of steps are reached which could cause crystalline defects, the test structures on various wafers or chips are available in parallel. These test structures can be examined and tested for crystalline defects without subjecting several additional wafers to a group of consecutive steps around the given process step.

In addition, a group of test structures may be subjected to a group of consecutive steps around the defects. However, the various ones of the test structures are subjected to different ones of the consecutive steps with each of the test structures having at least one of the steps eliminated from it. For example, if steps B, C and D could cause the formation of crystalline defects, then one test structure is subjected to steps B and D, leaving out step C, a second test structure is subjected to steps C and D, leaving out step B, and a third test structure is subjected to steps B and C, leaving out step D. In any case, the use of the test structures and method of this invention drastically improves an analysis of which step results in the undesired crystalline defects.

Examination for crystalline defects can be achieved by any well known process, such as stained etching and/or with a transmission electron microscope (TEM), or other known techniques. With the improved spatial resolution and accuracy provided by imaging integrated composite structures with the TEM, electron transparent areas as large as 0.5×0.5 mm$^2$ can be prepared in less than an hour. Mapping of the defects across whole wafers can be obtained by wet etching techniques. Stress analysis of large areas (400×400 micrometers$^2$) should be performed by x-ray diffraction. By correlating the results of the various applied mask levels on different test sites, the critical step is detected.

If a particular test structure is found to have crystalline defects which were not in the test structure on the initial wafers, then the step which was left out is known not to form crystalline defects. However, if one of the group of test structures is found to have the crystalline defects which are not found in the other test structure, then it is known that the step of the fabrication process which was left out of that one test structure causes the formation of the crystalline defects. Focused on this result, detailed analysis is continued, including, but not limited to, annealing experiments, stress analysis and analysis of the dependance of defects on the crystallographic orientations. Only the detailed analysis of dislocations/stacking faults with their Burger's vector provides means to understand the formation process. Stress simulation is based on these detailed results. With new TEM techniques, the analysis time is greatly reduced by about a factor of 5 to about one day. The electrical testing of the fully completed integrated circuits determines whether the crystalline defects formed during the process are of a magnitude as to adversely affect the operation of the integrated circuit. If it is found that the operation is so adversely affected, the step, or steps, which are found to cause the formation of crystalline defects is then changed to eliminate or limit the formation of the crystalline defects at that point along the process.

When testing integrated circuits formed in the wafers, consideration must be given to not only that crystalline defects are formed in the wafer, but also to where the crystalline defects are formed. Typically a plurality of integrated circuits are simultaneously formed in relatively large wafers, as large as eight inches in diameter. It has been found that different areas of a wafer can react differently to the various steps of making an integrated circuit with regard to the formation of crystalline defects. Thus, the area of a wafer around an outer edge thereof may react differently, i.e., may have crystalline defects form therein more readily, than the area thereof at the center of the wafer. Therefore, when examining the various additional wafers, it is necessary to examine a plurality of areas of a wafer at different parts thereof to be sure that a substantial portion of crystalline defects created are discovered.

Referring now to FIG. 1, there is shown a sectional view of a portion of an integrated circuit 10 which can be made by a process developed in accordance with a method of the present invention. Integrated circuit 10 typically contains a plurality (e.g., 64 million) of switched capacitor memory cells (only one of which is shown) which form a dynamic random access memory (DRAM). Integrated circuit 10 comprises a body 12 of a semiconductor material, such as single crystalline silicon, having a surface 14. A relatively narrow, deep trench 16 extends into the body 12 from the surface 14. A wider but shallower trench 18 extends into the body 12 from the surface 14 adjacent one side of the deep trench 16. The wall of the deep trench 16 is covered with a thin layer 20 of a dielectric material, typically silicon dioxide. The remaining portion of the deep trench 16 is filled with a body 22 of conductive polycrystalline silicon. The polycrystalline silicon body 22 and the silicon body 12 serve as the plates of a capacitor with the dielectric layer 20 therebetween. The shallow trench 18 is filled with an insulating material 24, typically silicon dioxide, to serve as an isolation means.

Adjacent a side of the deep trench 16 opposite the shallow trench 18, are spaced source and drain regions 26 and 28 of a MOS transistor which define a channel region 30 therebetween. The source and drain regions 26 and 28 are in the body 12 and extend to the surface 14 with the source region 26 being adjacent the deep trench 16. A layer 32 of an insulating material, typically silicon dioxide, is on the surface 14 over the channel region 30 and between the source and drain regions 26 and 28. On the insulating layer 32 and over the channel region 30 is a gate 34 of conductive polycrystalline silicon. Spacer layers 36 of silicon nitride extend across the sides of the gate 34, and a layer 40 of an insulating material, typically silicon dioxide, covers the gate 34. Contact layers 42 and 44 are on the surface 14 over the source and drain regions 26 and 28, respectively. The contact layers 42 and 44 are of a conductive material, such as a metal silicide. A conductive strap 46 of conductive polycrystalline silicon extends from the contact layer 42 of the source region 26 to the polycrystalline silicon body 22 in the deep trench 16. Thus, the source region 26 is electrically connected to the polycrystalline silicon body 22.

Figure 2:
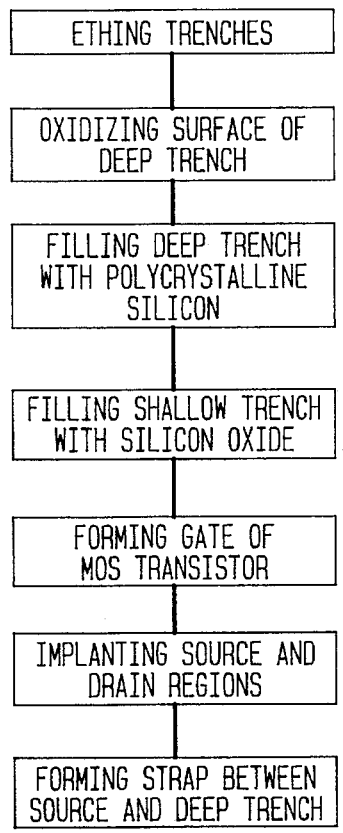
FIG. 2 is a flow chart showing a specific flow of process steps that might be used to form the integrated circuit shown in FIG. 1.

Referring now to FIG. 2, there is shown a flow diagram of basic steps of a process for fabricating the integrated circuit 10 shown in FIG. 1. The process for making the integrated circuit 10 includes the steps of:

(1) etching the trenches 16 and 18;

(2) oxidizing the surface of the deep trench 16 to form the dielectric layer 20;

(3) filling the deep trench 16 with the polycrystalline silicon body 22;

(4) filling the shallow trench 18 with silicon dioxide;

(5) forming the gate 34;

(6) ion-implanting the source and drain regions 26 and 28; and (7) forming the strap 46 between the source region 26 and the polycrystalline silicon body 22.

In carrying out the steps of the above process, the density of crystalline defects in the body 12 can result from many of the steps. These include filling the deep trench 16 with the polycrystalline silicon body 22; the various oxidation steps which form the various silicon dioxide layers and regions (the volume expansion due to the oxidation of silicon and the differential oxidation rate between the 100 surfaces and 110 trench side wall will stress the substrate); the formation of the gate 34; the formation of the silicon nitride spacer layers 36 and the silicide contact layers 42 and 44 since these layers are highly tensile; damage done by ion implanting the source and drain regions 26 and 28; and the formation of the strap 46 as a result of crystal damage during etching and from metal contamination. The density of crystalline defects may also be influenced by the kind of physical layout in combination with the process steps given above as will be explained later with regard to FIGS. 3 through 6.

To determine in the above fabrication process which steps may be causing undesirable crystalline defects to be formed in the silicon body, at least one semiconductor wafer was subjected to all of the steps to form completed integrated circuits on the wafer. A plurality of test structures were formed simultaneously with the formation of the completed integrated circuit using only some of the steps of making the completed integrated circuit. Table I shows the various sequences of steps use to make a complete integrated circuit (Sequence 1) and to make three different test structures (Sequences 1, 2 and 3).

TABLE I

| Sequence 1 | Sequence 2 | Sequence 3 |
| --- | --- | --- |
| Deep trench | | Deep trench |
| STI(shallow trench) | STI(shallow trench) | |
| Gate | Gate | Gate |
| Strap contact | Strap contact | Strap contact |
| Contact | Contact | Contact |
| Metal | Metal | Metal |

The completed integrated circuit was made using all of the steps shown in sequence 1. A first test structure (which may be on the one wafer or on an additional wafer) was formed by the steps shown in sequence 2 which formed the insulated filled shallow trench 18, the formation of the gate 34 and the implantation of the source and drain regions 26 and 28. However, no deep trench 16 was formed in the first test structure. The pattern of the cell formed was along a standard (110) crystallographic orientation.

A second test structure (either on the one wafer or on an additional wafer) was formed by the steps of sequence 3 of forming the filled deep trench 16, the gate 34 and the implantation of the source and drain regions 26 and 28. However, no shallow trench 18 was formed. The cells on the second test structure were also along the standard (110) crystallographic orientation. A third test structure was formed by the steps of sequence 1 of forming the filled deep trench 16, the filled shallow trench 18, the gate 34 and the implantation of the source and drain regions 26 and 28. However, the cells in the third test structure were along a (100) crystallographic orientation. Sequences 2 and 3 may be considered as subsets of the set of steps of sequence 1. By the method of the present invention, analysis with respect to the crystallographic orientation can be done at the same time on various chips of the same wafer. This reduces drastically the amount of effort and the time necessary for this type of investigation.

Fully completed integrated circuits were then electrically tested. Integrated circuits at various parts of the wafer, i.e., near the edge of the wafer and near the center of the wafer, were tested electrically. The electrical testing provided an indication of whether any of the steps of the process may have caused the formation of sufficient defects as to adversely affect the operation of the circuit. It also provided an indication of where along the surface of the wafer a problem mainly occurred. The test structures were examined for crystalline defects which may have been formed therein by the processing steps to which they were subjected. If the first test structure, which was not subjected to the formation of the deep trench 16, has dislocations, then the stress from the shallow trench fill 24 may contribute to the formation of defects during the implantation of the source and drain regions 26 and 28.

In testing integrated circuits formed by the above process, no dislocations were found in the second test structures, i.e., the test structures not subjected to the shallow trench 18. Thus, there appears to be a contribution of the shallow trench formation and filling that contributes to defect formation. Also, the comparison of the integrated circuits on the first and second test structures, which were along the normal 110 crystallographic orientation, to the third test structures, which were along the 100 crystallographic plane, indicated that the dislocations are sensitive the 110 orientation. No dislocations were observed in the 100 orientation. Having found that the undesirable defects were formed in the process of making the shallow trench 18 and had to do with the crystal orientation of the shallow trench 18, changes were made in the steps of fabrication of the integrated circuit to overcome this problem.

Referring now to FIG. 3, there is shown a schematic top plan view of the pattern of a portion of the integrated circuit of FIG. 1. FIG. 3 shows the pattern of the deep trench 16 and the pattern of the shallow trench 18 both extending along a standard 110 crystallographic orientation. As stated above, it was found that the defects formed in the wafer body 12 was caused by the shallow trench 18, and particularly by the orientation of the shallow trench 18.

Referring now to FIG. 4, there is shown a schematic top plan view of a pattern of the same portion of the integrated circuit shown in FIG. 3 which has been modified to correct for the above described problem. According to the method of in the present invention, both patterns have been put on the test site in closely spaced test structures at the same time. In the new pattern (FIG. 4), the deep trench 16 is still arranged along the standard 110 orientation, however, the design of the shallow trench, shown as shallow trench 118 (FIG. 4), has been modified from the shallow trench 18 (FIG. 3) so that it extends along the 100 orientation. As described above, no defect problem was discovered when the 100 orientation was used. When new integrated circuits were fabricated using this change in the orientation of the shallow trench, it was found that the defect density was reduced by orders of magnitude. Thus, with the change of only one mask, the mask used to form the shallow trench, a major change (reduction) in the density of defects formed in the body of the device was achieved.

Referring now to FIG. 5, there is shown a schematic top plan view of a portion of the integrated circuit 10 which includes the shallow trench 18 and the gate 34. Although not shown in FIG. 1, the gate 34 crosses a portion of the shallow trench 18 as is shown in FIG. 5. Misalignment of the masks used to form the shallow trench 18 and gate 34 can cause a variation in the amount of overlap between the shallow trench 18 and the gate 34. This overlap can cause defects as a result of the high stress from the silicon nitride layer spacer 36 as well as from the shallow trench 18 itself. To determine this, the following test was made in accordance with the method of the present invention:

(1) At least one wafer was subjected to the complete process to form completed integrated circuits in the wafers.

(2) A first test structure was subjected to the formation of the deep trench 16, the shallow trench 18, the gate 34 and the source and drain regions 26 and 28. The portions of the device were arranged along the standard 110 orientation.

(3) A second test structure was subjected to the formation of the deep trench 16, the shallow trench 18, the gate 34 and the source and drain regions 26 and 28. The portions of the device were arranged along the 100 orientation.

(4) A third test structure was subjected to the formation of the deep trench 16, the shallow trench 18, and the gate 34. The third test structure was not subjected to the formation of the source and drain regions 26 and 28.

(5) A fourth test structure was subjected to the formation of the deep trench 16, the gate 34 and the source and drain regions 26 and 28. The fourth test structure was not subjected to the formation of the shallow trench 18.

(6) A fifth test structure was subjected to the formation of a shallow trench 18, a gate 34 and source and drain regions 26 and 28. The fifth test structure was not subjected to the formation of a deep trench 16.

The fully processed integrated circuits were electrically tested and the test structures, which are not electrically functional because of being subjected to different, incomplete processing steps, were analyzed for crystalline defects in the wafer body. From these tests it was determined that undesirable crystalline defects were formed as a result of the overlap between the gate 34 and the shallow trench 18 because of the high stress from the silicon nitride spacer layer 36.

Referring to FIG. 6, there is shown a schematic top plan view of a solution to the above discussed problem. The shape of the shallow trench 18 (FIG. 5) was changed to that of the shallow trench 218 of FIG. 6 to have concave edges along which the gate 34 extends. The corners of the shallow trench overlap with the deep trench which thus reduced their impacted on the referred problem. This greatly reduced the overlap between the gate 34 and the shallow trench 218, and thereby reduced the crystalline defects formed in the wafer body. This was achieved by changing the design of only a single mask that was used to form the shallow trench 218. Again, both types of layout were provided on the test site adjacent to each other to allow for direct comparison with respect to crystal defect formation.

Thus, there is provided by the present invention a method of testing a process for making an integrated circuit to determine what steps of the process, cell geometry, and process sequence may cause the formation of undesirable crystalline defects in the body of the devices. This is achieved by a combination of a vertical process in which at least one wafer is subjected to the entire process to make fully completed integrated circuits, and horizontal processes in which several test structures are subjected to only a few of a group of the steps with each test structure being subjected to different ones of the group of steps. The fully completed integrated circuits allow for complete electrical testing thereof to determine whether the formation of crystalline defects was sufficient to adversely affect the operation of the integrated circuits. The test structures are analyzed for crystalline defects and to determine which of the steps caused the formation of the defects. The step that causes the defects can then be changed to reduce or eliminate the formation of the defects. Once all of the steps of a proposed process are tested by the method of the present invention, and changes made to limit the formation of crystalline defects, the resulting process can then be used to make the integrated circuits in a commercial operation. The method of the present invention allows the discovery of problem steps with the use of minimum number of wafers and provides a relatively simple method of actually determining which steps cause the formation of the defects.

It is to be appreciated and understood that the specific embodiments of the invention are merely illustrative of the general principles of the invention. Various modifications may be made consistent with the principles set forth. For example, FIG. 1 is an illustration of only a portion of one type of integrated circuit. The method of the present invention can be used for not only for structures of other parts of an integrated circuit, but for other structures of any type of integrated circuit. The more complex an integrated circuit which requires a great number of steps to process, the more useful the method of the present invention for determining which steps may cause or may be associated with the formation of undesirable crystalline defects and the correction of such steps.

What is claimed is:

1. A method of testing an integrated circuit manufacturing process, which comprises a set of sequential processing steps, for crystalline defect densities produced by the process so that the process may be modified to achieve a decrease in the crystalline defect density in the integrated circuits comprising the steps of:

processing a plurality of semiconductive bodies, some by a process that includes all of the set of sequential processing steps of the process being tested including steps for forming trenches in the semiconductive bodies having specific crystallographic orientations, and others by a process that includes different subsets of said set, the subsets including steps for forming trenches in the semiconductive bodies having crystallographic orientations different from the specific orientations; and comprising the defect densities in the plurality of processed semiconductive bodies for determining the effect on defect densities of the steps of the manufacturing process for use in modifying the manufacturing process for reducing the defect density of the integrated circuits produced.

2. The method of testing of claim 1 in which all of the semiconductive bodies are processed as different parts of a common wafer.

3. The method of testing of claim 1 in which said some of said others of the semiconductive bodies are processed as parts of different wafers.

4. The method of testing of claim 1 in which relatively wide relatively shallow trenches and relatively narrow relatively deep trenches are oriented in different crystallographic orientations in subsets of sequential processing steps.

5. A method of reducing the crystalline defect density formed in a semiconductive wafer that houses a dynamic random access memory comprising the steps of:

subjecting one portion of a crystalline semiconductive wafer to a set of sequential processing steps for forming therein a dynamic random access memory that is amenable to electrical testing;

forming in said wafer, simultaneously with the formation of said memory, a plurality of test structures, each by subjecting a different portion of the wafer to a different subset of the set of processing steps, the subsets producing variations in the orientation of trenches of the dynamic random access memory with respect to crystallographic axes and in the overlap of various regions of the dynamic random access memory;

measuring the defect densities in the test structures for identifying the processing steps responsible for defect creation; and modifying processing steps responsible for defect creation for reducing defect density in the dynamic random access memory.

6. A method for making a switched capacitor dynamic random access memory comprising the steps of:

etching in a monocrystalline silicon wafer first and second sets of trenches, the first set including trenches that are relatively deep and relatively narrow for serving to house one plate of switched capacitors of memory cells of the dynamic random access memory and the second set including trenches that are relatively shallow and relatively wide for serving to house isolation regions in the memory cells;

oxidizing walls of the trenches in the first set to form dielectrics of the switched capacitors;

filling the trenches of the first set selectively with polycrystalline silicon to form one plate of each of the switched capacitors;

filling the trenches of the second set with silicon dioxide;

forming gates on a surface of the silicon wafer;

ion implanting selected regions on opposite sides of each gate to form source and drain regions of the memory cells;

forming a conductive strap on the surface of the silicon wafer interconnecting each source region with the polycrystalline fill of a deep trench; and characterized in that the orientation of the set of deep narrow trenches is in the 110 crystallographic direction of the silicon wafer and the orientation of the set of shallow wide trenches is in a 100 crystallographic direction of the silicon wafer.

7. The method of claim 6 further characterized in that the configuration of the wide shallow trenches is shaped to reduce the overlap of the gates over such trenches.

* * * * *